(12) United States Patent
Satoskar et al.

(10) Patent No.: US 10,840,891 B2
(45) Date of Patent: Nov. 17, 2020

(54) LOW POWER DIGITAL INTERPOLATION/DECIMATION APPARATUS AND METHOD

(71) Applicant: Cirrus Logic International Semiconductor Ltd., Edinburgh (GB)

(72) Inventors: Aniruddha Satoskar, Round Rock, TX (US); John L. Melanson, Austin, TX (US); Siva Venkata Subbarao Bonasu, Austin, TX (US)

( * ) Notice: Subject to any disclaimer, the term of this patent is extended or adjusted under 35 U.S.C. 154(b) by 55 days.

(21) Appl. No.: 16/231,936

(22) Filed: Dec. 24, 2018

(65) Prior Publication Data

US 2020/0204161 A1 Jun. 25, 2020

(51) Int. Cl.
*H03H 17/06* (2006.01)
*G06F 17/17* (2006.01)

(52) U.S. Cl.
CPC ......... *H03H 17/0657* (2013.01); *G06F 17/17* (2013.01); *H03H 17/0664* (2013.01)

(58) Field of Classification Search
CPC .............. H03H 17/0657; H03H 17/0664
See application file for complete search history.

(56) References Cited

U.S. PATENT DOCUMENTS

| | | | |
|---|---|---|---|
| 8,421,660 B1 * | 4/2013 | Wan | H03M 3/392 341/118 |
| 8,581,756 B1 | 11/2013 | Duewer et al. | |
| 9,071,267 B1 | 6/2015 | Schneider et al. | |
| 9,071,268 B1 | 6/2015 | Schneider et al. | |
| 9,148,164 B1 | 9/2015 | Schneider et al. | |
| 9,391,576 B1 | 7/2016 | Satoskar et al. | |
| 9,525,940 B1 | 12/2016 | Schneider et al. | |
| 9,596,537 B2 | 3/2017 | He et al. | |
| 9,748,929 B1 * | 8/2017 | Lamb | H03H 17/0294 |
| 9,813,814 B1 | 11/2017 | Satoskar et al. | |
| 9,831,843 B1 | 11/2017 | Das et al. | |
| 9,880,802 B2 | 1/2018 | Satoskar et al. | |
| 9,998,823 B2 | 6/2018 | He et al. | |

(Continued)

OTHER PUBLICATIONS

Kuo, Ko-Chi. "Transconductor." Advances in Solid State Circuits Technologies. Book edited by: Paul K. Chu. Apr. 2020, INTECH, Croatia. Downloaded from SCIYO.COM. www.intechopen.com pp. 25-44.

*Primary Examiner* — Chuong D Ngo

(57) ABSTRACT

An apparatus performs interpolation/decimation in a digital circuit that receives an input signal and includes upsampling/downsampling and filtering stages. First and second paths include distinct first and second portions of the upsampling/downsampling and filtering stages. The first path consumes less quiescent state power. A selection circuit uses the first or second path and turns off the unused first or second path based on input signal spectral content or level. A mode includes applying a front-end digital/analog gain and a corresponding back-end analog/digital attenuation in conjunction with the first path being used and the second path being turned off. A cross-fader uses the first and second paths in a weighted mix manner while making a transition between using the first and second paths. The second path has higher filtering performance (e.g., superior stopband attenuation, passband ripple, transition band, e.g., via higher order or greater bit-width filtering).

28 Claims, 10 Drawing Sheets

(56) References Cited

U.S. PATENT DOCUMENTS

| | | | |
|---|---|---|---|
| 9,998,826 B2 | 6/2018 | Satoskar | |
| 2004/0120361 A1* | 6/2004 | Yu | H03H 17/0628 370/545 |
| 2014/0361913 A1* | 12/2014 | Hsieh | H03H 17/0294 341/143 |

* cited by examiner

LOW POWER DIGITAL INTERPOLATION/DECIMATION APPARATUS AND METHOD

BACKGROUND

Digital interpolators and decimators are an integral part of many electronic circuits, such as a high-performance audio coder/decoder (codec). Generally speaking, a digital interpolator receives a digital input signal comprising a sequence of samples at an input sampling rate (e.g., 96 kHz) and adds samples between the input samples to increase the output signal sampling rate (e.g., to 192 kHz). The conversion from lower sampling rate input signal to the higher sampling rate output signal is sometimes referred to as upsampling. Typically, upsampling creates images of the input signal at frequencies outside the frequency band of the input signal. For example, if the input signal is in the audio band (e.g., 20 Hz to 20 kHz), images of the input signal may be created outside the audio frequency band, which may be referred to as out-of-band images, or out-of-band noise. Digital interpolators typically also include a passband filter that attenuates the out-of-band images created by the upsampling and smooths the added samples.

A digital filter interpolator has a passband of frequencies that the filter passes through the input signal (e.g., audio frequency band) and a stopband of frequencies that the filter attenuates, as well as a transition band between the passband and stopband. The effectiveness, or performance, of a digital interpolator filter may be measured in terms of its stopband attention (also referred to as stop-band rejection), its passband ripple characteristic, and its transition band characteristic, among other parameters. The passband ripple is the amount of fluctuation, or variation, in the frequency magnitude response within the passband of the filter. The transition band is the frequency range between the passband and the stopband.

A digital decimator performs a complementary function to an interpolator in that it receives a digital input signal comprising a sequence of samples at an input sampling rate and removes samples to decrease the output signal sampling rate. The conversion from higher sampling rate input signal to the lower sampling rate output signal is sometimes referred to as downsampling or subsampling. Typically, downsampling folds back out-of-band noise into the frequency band of interest. Consequently, stopband filtering is needed in the digital decimator to attenuate the aliased folded-back images.

There is a demand for lower power consumption in many devices, such as battery-powered mobile devices, e.g., mobile phones, tablets, mobile audio devices. On the other hand, a demand for increased performance (e.g., improved passband ripple and stopband attenuation) may carry a significant increase in the power consumption of the interpolator or decimator, causing it to represent a significant portion of the digital datapath power consumption, e.g., of an audio codec.

SUMMARY

In one embodiment, the present disclosure provides an apparatus for performing interpolation in a digital circuit that receives an input signal. The apparatus includes a plurality of upsampling stages and filtering stages used to perform interpolation. A first path includes a first portion of the plurality of upsampling stages and filtering stages, and a second path includes a second portion of the plurality of upsampling stages and filtering stages distinct from the first portion. The first path consumes less quiescent state power than the second path. The apparatus also includes a selection circuit configured to determine a spectral content of the input signal and use the first or second path and turn off the unused first or second path based on the spectral content.

In another embodiment, the present disclosure provides a method for performing interpolation in a digital circuit that receives an input signal. The digital circuit includes a plurality of upsampling stages and filtering stages used to perform interpolation. A first path includes a first portion of the plurality of upsampling stages and filtering stages, and a second path includes a second portion of the plurality of upsampling stages and filtering stages distinct from the first portion. The first path consumes less quiescent state power than the second path. The method includes determining a spectral content of the input signal and using the first or second path and turning off the unused first or second path based on the spectral content.

In yet another embodiment, the present disclosure provides an apparatus for performing interpolation in a digital circuit that receives an input signal. The apparatus includes a plurality of upsampling stages and filtering stages used to perform interpolation. A first path includes a first portion of the plurality of upsampling stages and filtering stages, and a second path includes a second portion of the plurality of upsampling stages and filtering stages distinct from the first portion. The first path consumes less quiescent state power than the second path. The apparatus also includes a selection circuit configured to use the first or second path and turn off the unused first or second path based on a level of the input signal.

In yet another embodiment, the present disclosure provides a method for performing interpolation in a digital circuit that receives an input signal. The digital circuit includes a plurality of upsampling stages and filtering stages used to perform interpolation. A first path includes a first portion of the plurality of upsampling stages and filtering stages, and a second path includes a second portion of the plurality of upsampling stages and filtering stages distinct from the first portion. The first path consumes less quiescent state power than the second path. The method includes using the first or second path and turning off the unused first or second path based on a level of the input signal.

In yet another embodiment, the present disclosure provides an apparatus for performing decimation in a digital circuit that receives an input signal. The apparatus includes a plurality of downsampling stages and filtering stages used to perform decimation. A first path includes a first portion of the plurality of downsampling stages and filtering stages, and a second path includes a second portion of the plurality of downsampling stages and filtering stages distinct from the first portion. The first path consumes less quiescent state power than the second path. The apparatus also includes a selection circuit configured to determine a spectral content of the input signal and use the first or second path and turn off the unused first or second path based on the spectral content.

In yet another embodiment, the present disclosure provides a method for performing decimation in a digital circuit that receives an input signal. The digital circuit includes a plurality of downsampling stages and filtering stages used to perform decimation. A first path includes a first portion of the plurality of downsampling stages and filtering stages, and a second path includes a second portion of the plurality of downsampling stages and filtering stages distinct from the first portion. The first path consumes less quiescent state power than the second path. The method includes determining a spectral content of the input signal and using the first or second path and turning off the unused first or second path based on the spectral content.

In yet another embodiment, the present disclosure provides an apparatus for performing decimation in a digital circuit that receives an input signal. The apparatus includes a plurality of downsampling stages and filtering stages used to perform decimation. A first path includes a first portion of the plurality of downsampling stages and filtering stages, and a second path includes a second portion of the plurality of downsampling stages and filtering stages distinct from the first portion. The first path consumes less quiescent state power than the second path. The apparatus also includes a selection circuit configured to use the first or second path and turn off the unused first or second path based on a level of the input signal.

In yet another embodiment, the present disclosure provides a method for performing decimation in a digital circuit that receives an input signal. The digital circuit includes a plurality of downsampling stages and filtering stages used to perform decimation. A first path includes a first portion of the plurality of downsampling stages and filtering stages, and a second path includes a second portion of the plurality of downsampling stages and filtering stages distinct from the first portion. The first path consumes less quiescent state power than the second path. The method includes using the first or second path and turning off the unused first or second path based on a level of the input signal.

DETAILED DESCRIPTION

Described are embodiments of a digital interpolator that includes first and second paths that consume respectively higher and lower power at quiescent state and accomplish respectively higher and lower performance and a switching circuit that switches between using the first and second paths and turns off the unused path. The switching is based on a characteristic of the input signal to the interpolator, e.g., input signal level and/or input signal frequency spectrum. When the input signal is at a higher level or has a richer frequency spectral content, the aliased images created by upsampling require better filtering, which is provided by the higher power path. However, when the input signal is at a lower level or has a poorer frequency spectral content, the aliased images created by upsampling may be handled by lesser filtering, which is provided by the lower power path. Hence, power consumption may be reduced when the input signal is at lower levels or has a poor frequency spectral content, while good performance may be provided regardless of input signal characteristics. A cross-fader may provide a weighted mix of the two path outputs during the switching transition in order to reduce undesirable signal artifacts (e.g., perceptible to an audio device listener) that might otherwise be introduced by immediate switching. In a similar fashion, described are embodiments of a digital decimator that includes first and second paths that consume respectively higher and lower power and accomplish respectively higher and lower performance and a switching circuit that switches between using the first and second paths and turns off the unused path. The decimator path switching may similarly be performed based on signal level and/or frequency spectrum and may similarly include crossfading. Furthermore, dynamic range enhancement (DRE) may be employed synergistically in audio circuitry that includes the multi-path interpolator/decimator with respect to the path switching. In particular, digital attenuation (with corresponding prior analog gain) of the DRE technique may be incorporated into the low power path of the decimator to aid in attenuating out-of-band noise that may be folded back by downsampling, which may enable the low power path to be constructed with lower filtering performance.

Figure 1:
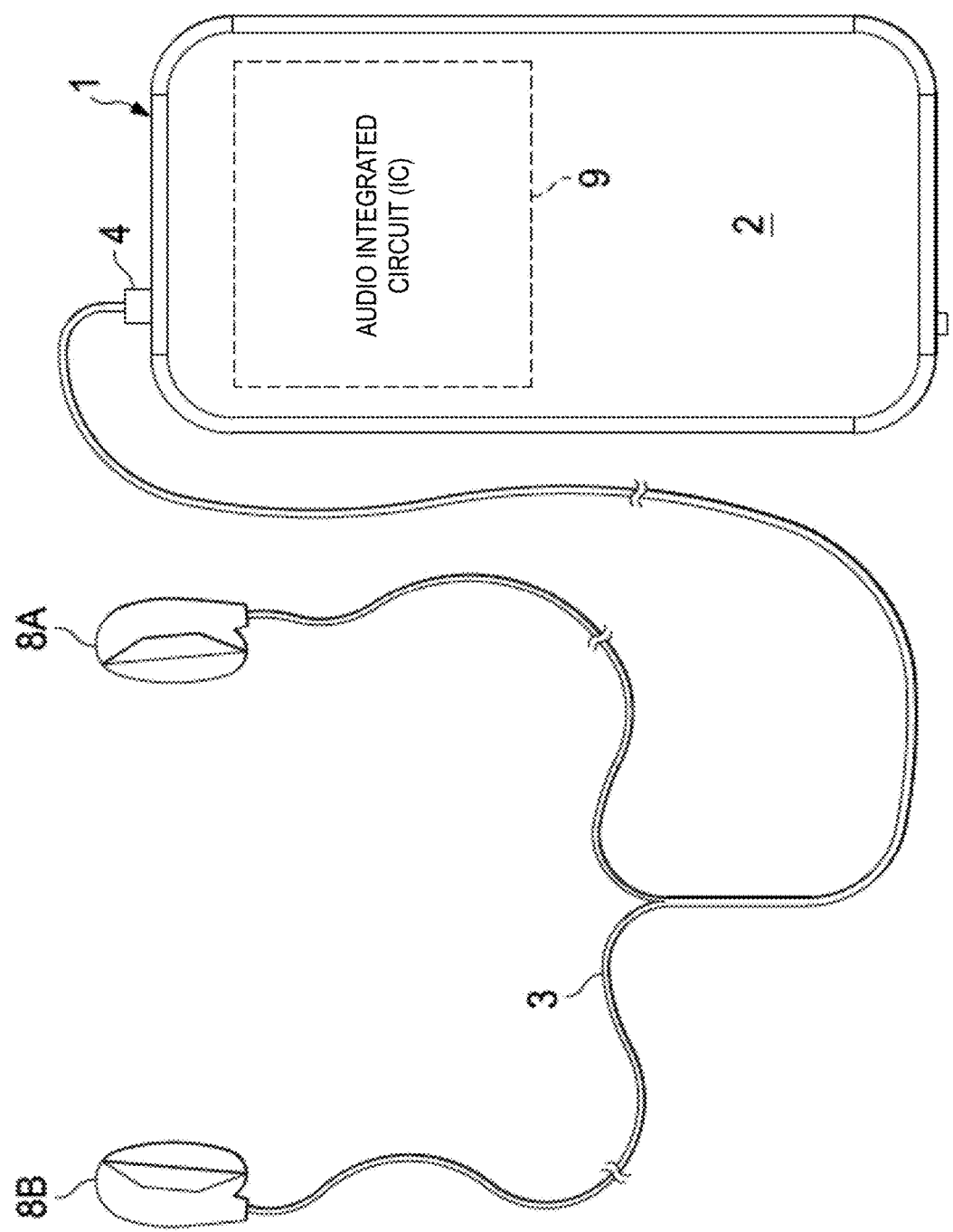
FIG. 1 is an illustration of an example personal audio device in accordance with embodiments of the present disclosure.

Referring now to FIG. 1, an illustration of an example personal audio device 1, in accordance with embodiments of the present disclosure is shown. FIG. 1 depicts personal audio device 1 coupled to a headset 3 in the form of a pair of earbud speakers 8A and 8B. Headset 3 may also include a microphone, pickup or other input transducer (not shown) to receive audio waves and convert the audio waves to an audio signal. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1, or alternatively, headset 3 may be a wireless headset. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 or another audio transducer (e.g., a loudspeaker) or a line level signal output for receiving an analog audio signal from headset 3. The audio IC 9 may include a microcontroller that performs various functions described herein. Although embodiments are described in the context of a personal audio device, other embodiments are contemplated for use in other audio applications.

Figure 2:
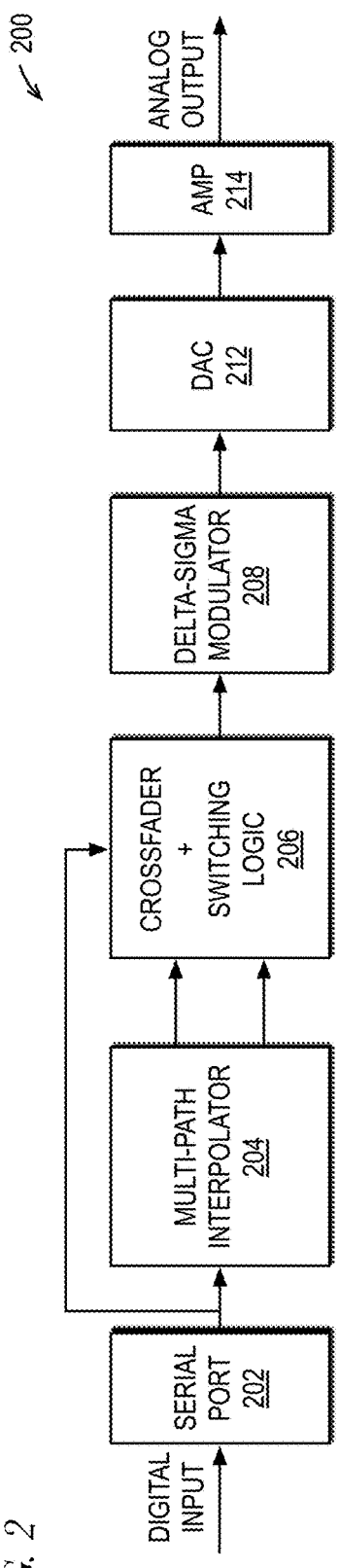
FIG. 2 is a block diagram of an embodiment of audio circuitry such as may be included in an audio IC of FIG. 1 that includes a multi-path interpolator.

Referring now to FIG. 2, an example block diagram of audio circuitry 200 (e.g., included in an audio IC 9 of FIG. 1), in accordance with embodiments of the present disclosure is shown. The audio circuitry 200 includes a serial port 202 that receives a digital input signal, a multi-path interpolator 204 that receives an output of the serial port 202 as a digital input signal, a block 206 that includes switching logic and a crossfader that receives outputs of the multiple paths of the multi-path interpolator 204, a delta-sigma modulator 208 that receives an output of the switching logic and crossfader 206, a digital-to-analog converter (DAC) 212 that converts the digital output of the delta-sigma modulator 208 to an analog signal, and an amplifier 214 (e.g., class-D amplifier) that receives the analog signal from the delta-sigma modulator 208 and generates an analog output, e.g., for provision to an audio transducer (e.g., headphone) or line level signal output. The multi-path interpolator 204 operates to interpolate the digital input signal received from the serial port 202. As described in more detail below, the multi-path interpolator 204 includes a low power path and a high power path whose outputs may be selected/used by the switching logic 206 based on one or more characteristics of the digital input signal (e.g., digital input signal frequency spectrum and/or signal level), and the unselected/unused path may be turned off. In this manner, advantageously, power consumption may be reduced as the monitored characteristic of the digital input signal permits. The switching logic 206 also receives the digital input signal from the serial port 202 in order to monitor the digital input signal.

Figure 3:
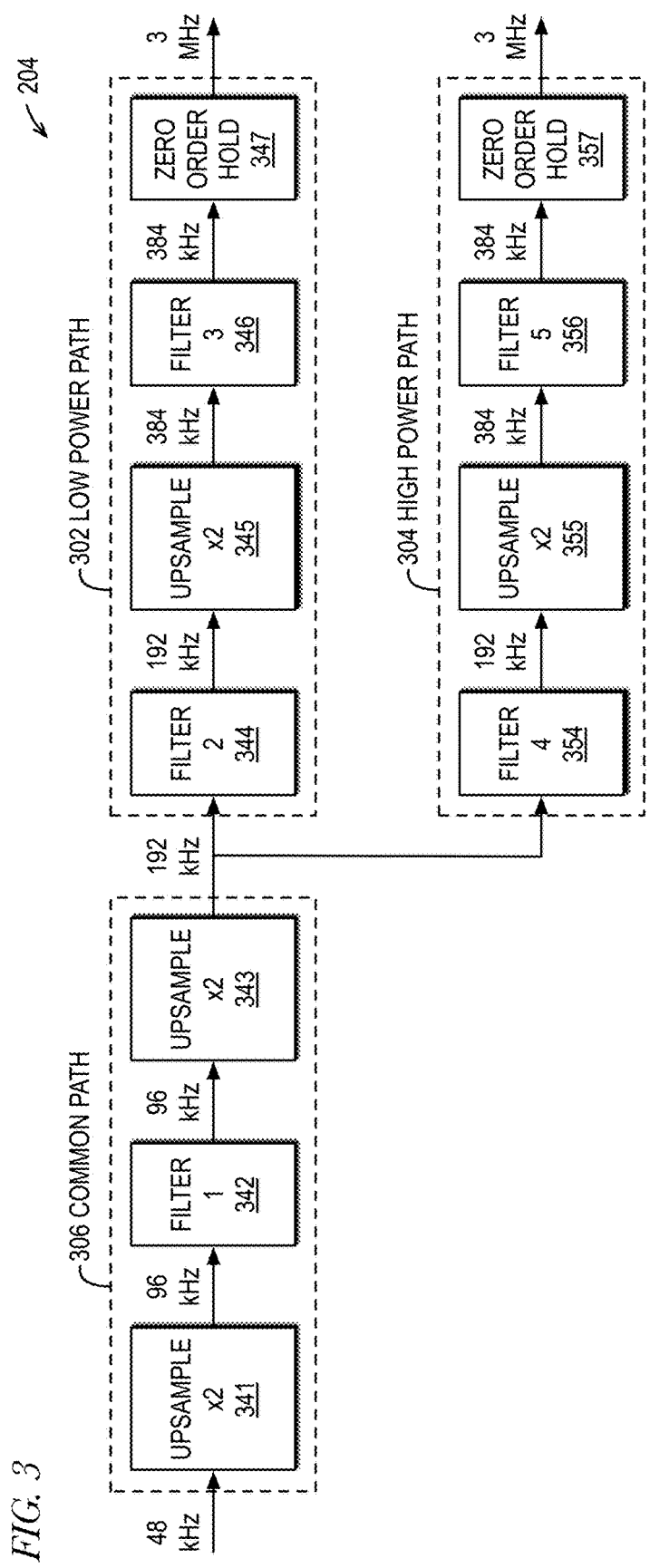
FIG. 3 is a block diagram of an embodiment of a multi-path interpolator such as that of FIG. 2.

Referring now to FIG. 3, an example block diagram of a multi-path interpolator 204 (e.g., multi-path interpolator 204 of FIG. 2), in accordance with embodiments of the present disclosure is shown. The multi-path interpolator 204 includes a plurality of upsample stages and filter stages. In the embodiment of FIG. 3, the upsample stages and filter stages are grouped into a common path 306, a low power path 302 and a high power path 304. The common path 306 receives the digital input signal (e.g., 48 kHz). In the embodiment of FIG. 3, the common path 306 includes a first upsample x2 stage 341 that outputs a 96 kHz signal received by a filter 1 stage 342 that provides a filtered 96 kHz signal to a second upsample x2 stage 343 that outputs a 192 kHz signal to both the low power path 302 and the high power path 304. The low power path 302 includes a filter 2 stage 344 that provides a filtered 192 kHz signal to a third upsample x2 stage 345 that outputs a 384 kHz signal received by a filter 3 stage 346 that provides a filtered 384 kHz signal to a zero order hold stage 347 that outputs a 3 MHz signal. The high power path 304 includes a filter 4 stage 354 that provides a filtered 192 kHz signal to a fourth upsample x2 stage 355 that outputs a 384 kHz signal received by a filter 5 stage 356 that provides a filtered 384 kHz signal to a zero order hold stage 357 that outputs a 3 MHz signal. The upsampling performed by the upsample stages creates out-of-band images, i.e., images of the digital input signal out of the audio band (also referred to as aliasing), and the filter stages attenuate the generated out-of-band images. Generally speaking, the amplitude of the out-of-band images caused by the upsampling is proportional to the amplitude of the input signal. For example, for a 1 kHz input signal whose level drops by 5 dB, the corresponding image created at 47 kHz will also drop by 5 dB. Similarly, the spectral content richness of the out-of-band images caused by the upsampling is proportional to the spectral content richness of the input signal. Hence, when the amplitude or spectral richness of the input signal is higher, better filtering is required to remove the injected out-of-band images; whereas, when the amplitude or spectral richness of the input signal is lower, worse filtering may be employed to remove the injected out-of-band images, which may facilitate lower power consuming filters in the low power path 302. In one embodiment, the filter stages consume more power than the upsample stages.

Figure 4:
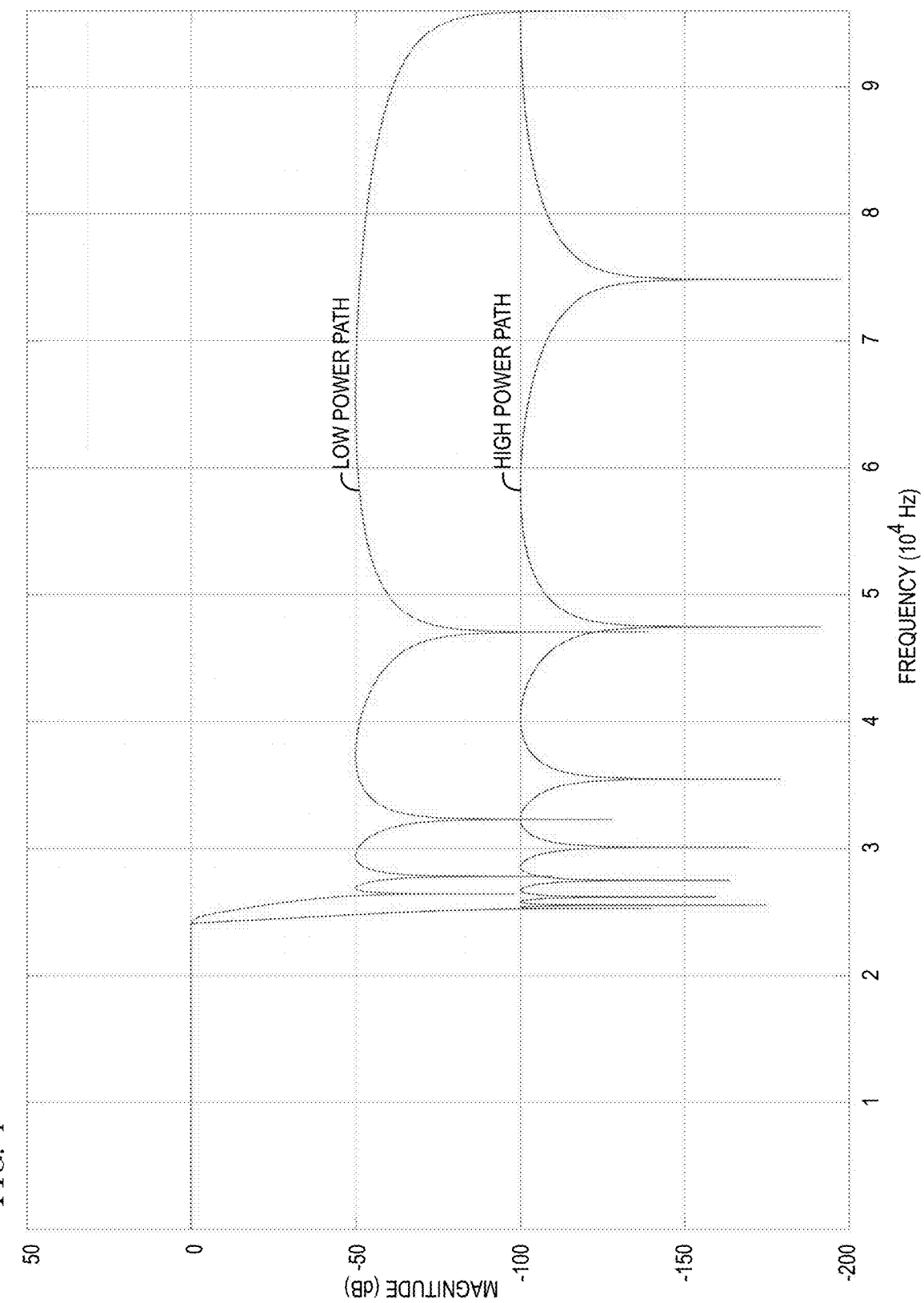
FIG. 4 is a frequency response graph of a multi-path interpolator such as that of FIG. 3.

The low power path 302 consumes less power than the high power path 304 at quiescent state, i.e., in the presence of a minimal input signal. In one embodiment, the filter 2 stage 344 and filter 3 stage 346 consume less quiescent stage power than the filter 4 stage 354 and filter 5 stage 356, and filter 4 stage 354 and filter 5 stage 356 have higher filtering performance than filter 2 stage 344 and filter 3 stage 346. In one embodiment, the higher filtering performance may include superior stopband attenuation (as shown in FIG. 4) and/or superior passband ripple and/or superior transition band properties (e.g., smaller transition band). In one embodiment, the higher filtering performance may be accomplished because filter 4 stage 354 and filter 5 stage 356 have higher order filtering than filter 2 stage 344 and filter 3 stage 346 and/or because filter 4 stage 354 and filter 5 stage 356 have greater bit width than filter 2 stage 344 and filter 3 stage 346, which may enable filter 2 stage 344 and filter 3 stage 346 to consume less power than filter 4 stage 354 and filter 5 stage 356.

The switching logic 206 (of FIG. 2) monitors the digital input signal and based thereon selects the low power path 302 output or the high power path 304 output for use, i.e., for provision as the output (e.g., to the delta-sigma modulator 208 of FIG. 2). In one embodiment, the switching logic 206 selects the output of the low power path 302 or high power path 304 based on the signal level of the digital input signal. In another embodiment, the switching logic 206 includes circuitry that extracts the spectral content of the digital input signal (e.g., differentiator followed by a peak or average power detector, although other circuits that extract the spectral content may be employed), and the switching logic 206 selects the output of the low power path 302 or high power path 304 based on the frequency spectrum content of the digital input signal. In one embodiment, the switching logic 206 selects the low power path 302 or high power path 304 based on whether or not the spectral content has spectral components in a particular range of frequencies. For example, the switching logic 206 may select the high power path 304 if the spectral content of the digital input signal is less than 1.5 kHz threshold frequency and otherwise select the low power path 302. The embodiments may be particularly beneficial in instances in which energy content of audio frequencies above the threshold frequency is minimal in the digital input signal, which may often be the case, e.g., in the presence of a predominance of music or speech audio, because generally higher performing filters are required to filter content in the higher frequencies of the audio range. However, other embodiments are contemplated in which the threshold frequency is different and/or in which other spectral content criteria are employed.

During a transition between use of the low power path 302 and high power path 304 (in either direction), the crossfader 206 (of FIG. 2) mixes the outputs of the low power path 302 and high power path 304 in a weighted manner to provide the output. For example, during a transition from using the low power path 302 to using the high power path 304, the crossfader 206 will initially give more weight to the low power path 302 output and less weight to the high power path 304 and over the course of the transition reduce the weight of the low power path 302 and increase the weight of the high power path 304 until the weight of the low power path 302 is zero and the weight of the high power path 304 is one, at which time the switching logic 206 may power off the low power path 302 (which may be subject to a hysteresis delay, e.g., as described with respect to FIGS. 5 and 6). A converse operation may be performed by the crossfader 206 during a transition from using the high power path 304 to using the low power path 302.

Other embodiments of the multi-path interpolator 204 are contemplated with different groupings of the plurality of upsample stages and filter stages. For example, embodiments are contemplated without a common path. For another example, embodiments are contemplated in which a common path follows the low power path 302 and high power path 304.

Referring now to FIG. 4, a frequency response graph of a multi-path interpolator (e.g., multi-path interpolator 204 of FIG. 3) according to an embodiment is shown. The graph depicts frequency on the horizontal axis and attenuation (in dB) on the vertical axis. More specifically, frequency magnitude response of the multi-path interpolator 204 when using the low power path 302 is shown on a first graph, and frequency magnitude response of the multi-path interpolator 204 when using the high power path 304 is shown on a second graph, as indicated. As shown, when using either path the attenuation is 0 dB (no attenuation) in a passband region from zero to approximately 23 kHz. In a stopband attenuation region (after a transition region of approximately 200 Hz), when the low power path 302 is used, the frequency magnitude response is nominally −50 dB, and when the high power path 304 is used, the frequency magnitude response is nominally −100 dB. In the embodiment of FIG. 4, there is negligible passband ripple, although the stopband ripple of the high power path 304 is approximately 85 dB and the stopband ripple of the low power path 302 is approximately 95 dB, as shown.

Figure 5:
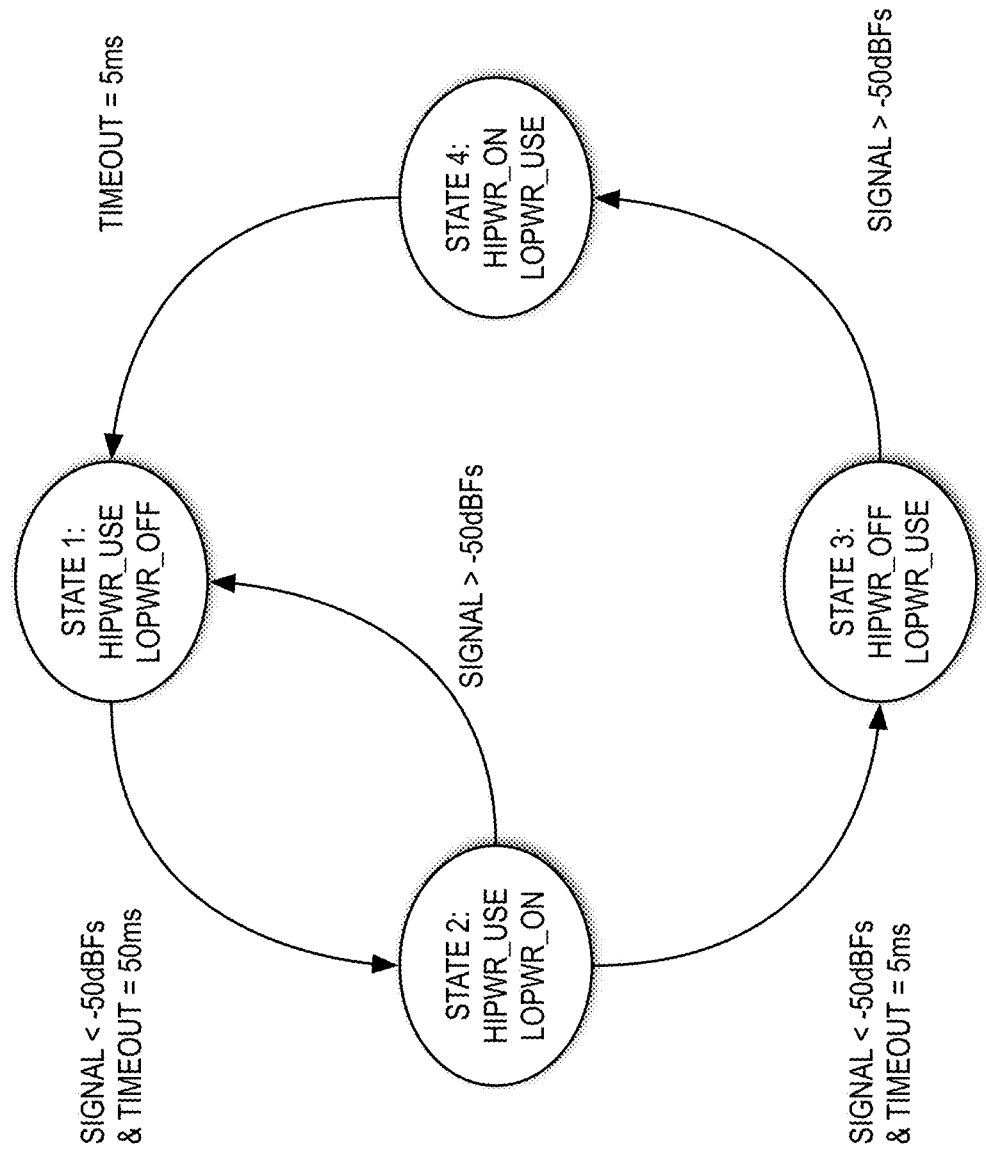
FIG. 5 is a finite state machine (FSM) illustrating operation of the multi-path interpolator of FIG. 3 according to one embodiment.

Referring now to FIG. 5, a finite state machine (FSM) illustrating operation of the multi-path interpolator 204 of FIG. 3 according to one embodiment is shown. The FSM includes four states denoted states 1 through 4. In state 1, the high power path 304 is used and the low power path 302 is turned off. In state 2, the high power path 304 is used and the low power path 302 is turned on in preparation for transition to use thereof. In state 3, the low power path 302 is used and the high power path 304 is turned off. In state 4, the low power path 302 is used and the high power path 304 is turned on in preparation for transition to use thereof.

In the embodiment of FIG. 5, the digital input signal level is employed (e.g., by switching logic 206) to make state transition decisions. A transition from state 1 to state 2 is made in response to detecting that the input signal level has dropped below −50 dBFs for at least 50 milliseconds. A transition from state 2 to state 1 is made in response to detecting that the input signal level has risen above −50 dBFs. A transition from state 2 to state 3 is made in response to detecting that the input signal level has remained below −50 dBFs for an additional 5 milliseconds. A transition from state 3 to state 4 is made in response to detecting that the input signal level has risen above −50 dBFs. A transition from state 4 to state 1 is made after 5 milliseconds. As described above, a crossfader (e.g., 206 of FIG. 2) may be employed to mix the outputs of the low power path 302 and the high power path 304 in a weighted fashion during transitions between states 2 and 3 and during transitions between states 4 and 1, i.e., during transitions between using the low power path 302 and high power path 304.

Although an embodiment is described with particular signal level (e.g., −50 dBFs) and timeout values, these values are selected for illustration purposes, and other embodiments are contemplated with different values. Furthermore, embodiments are contemplated in which the signal level includes hysteresis to avoid repetitive switching.

Advantageously, switching between the low power path 302 and the high power path 304 may be performed in a relatively slow fashion relative to changes in the level of the input signal in contrast to path switching in other aspects of audio circuitry, such as audio codecs. For example, clipping that may result in unacceptable audible clicks or pops may be caused by failure to switch quickly enough from one path to another in response to a sudden rise in input signal level in the case of other path switching, e.g., analog-to-digital converter (ADC) switching, output stage switching, delta-sigma modulator path switching. However, in the case of the multi-path interpolator 204, when the input signal level rises more suddenly than the switching logic 206 transitions to using the high power path 304, less attenuated out-of-band images may occur for a relatively short time. However, the audible effects of the less attenuated out-of-band images, particularly of short duration, may be much more acceptable than those caused by clipping.

Figure 6:
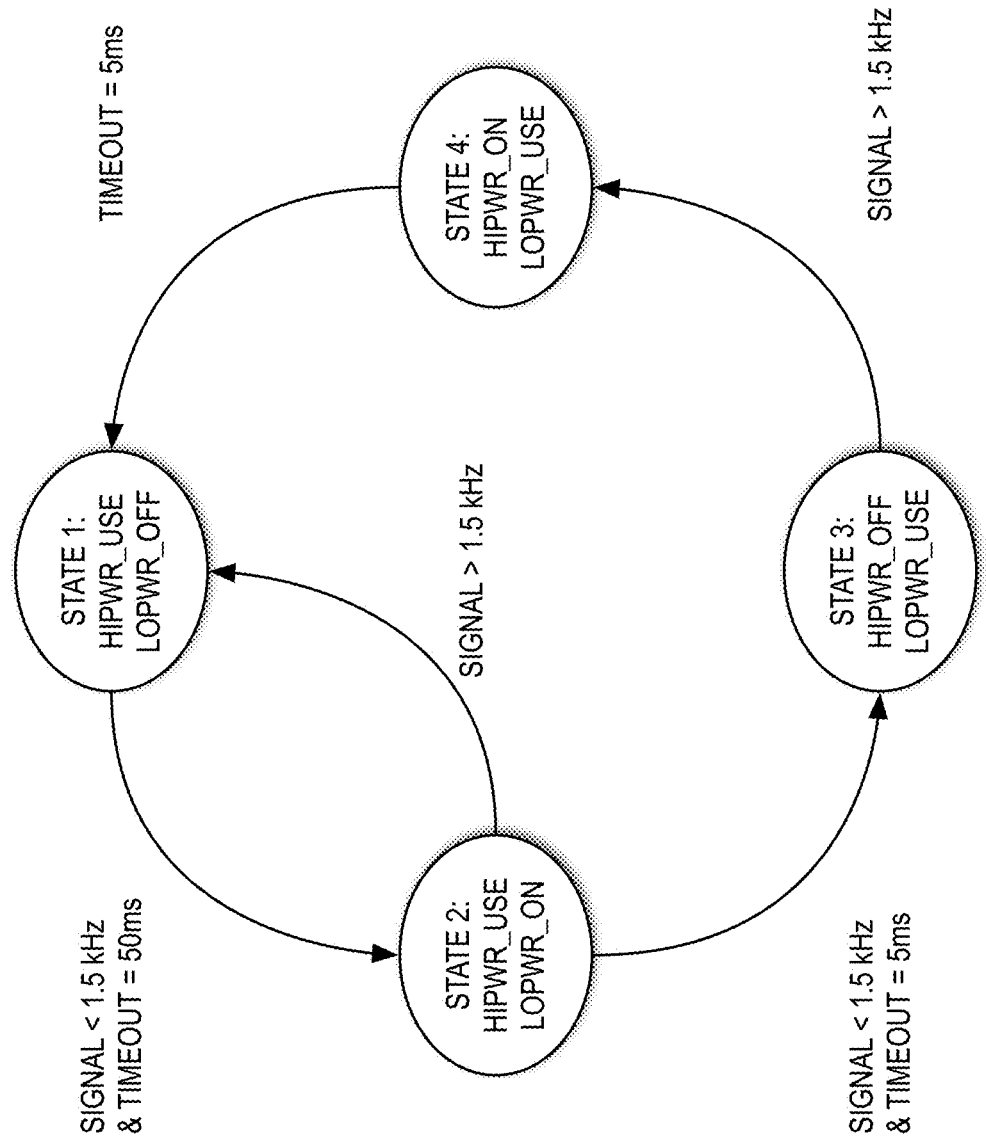
FIG. 6 is a finite state machine (FSM) illustrating operation of the multi-path interpolator of FIG. 3 according to an alternate embodiment.

Referring now to FIG. 6, a finite state machine (FSM) illustrating operation of the multi-path interpolator 204 of FIG. 3 according to an alternate embodiment is shown. The embodiment of FIG. 6 is similar to the embodiment of FIG. 5 in many respects, including the states. However, in the embodiment of FIG. 6, the input signal spectral content is employed to make state transition decisions. A transition from state 1 to state 2 is made in response to detecting that the input signal spectral content is less than 1.5 kHz for at least 50 milliseconds. A transition from state 2 to state 1 is made in response to detecting that the input signal spectral content is greater than 1.5 kHz. A transition from state 2 to state 3 is made in response to detecting that the input signal spectral content has remained less than 1.5 kHz for an additional 5 milliseconds. A transition from state 3 to state 4 is made in response to detecting that the input signal spectral content is greater than 1.5 kHz. A transition from state 4 to state 1 is made after 5 milliseconds. As described above, a crossfader (e.g., 206 of FIG. 2) may be employed to mix the outputs of the low power path 302 and the high power path 304 in a weighted fashion during transitions between states 2 and 3 and during transitions between states 4 and 1, i.e., during transitions between using the low power path 302 and high power path 304. Although an embodiment is described with particular spectral content frequency threshold (e.g., 1.5 kHz) and timeout values, these values are selected for illustration purposes, and other embodiments are contemplated with different values. Furthermore, embodiments are contemplated in which the spectral content frequency threshold includes hysteresis to avoid repetitive switching.

As described above, the level/spectral richness of the out-of-band images is largely a function of the input signal level/spectral richness. Combining this observation with the earlier-mentioned observations of increased interpolator datapath power consumption driven by demand for increased passband ripple and stopband attenuation and requirement for lower quiescent state power consumption, embodiments of a digital interpolator are described that have a high power/performance path used for higher level or higher frequency spectral content signals that cause higher level out-of-band images, and the digital interpolator has a low power/performance quiescent state path for lower level or lower frequency spectral content input signals that cause lower level/less frequency-rich out-of-band images that require minimal stopband attenuation to bury the out-of-band images in the noise floor of the system. Advantageously, the high performance path may be clock-gated in quiescent/low signal conditions when the low power path is being used to save power (and the low power path may be clock-gated when the high performance path is being used).

In one embodiment, the quiescent state path may have lower order filtering, lesser bitwidth, or both compared to the high performance path. In an application in which the input signal level increases rapidly, an embodiment with lower order filtering may be preferable since it may allow use of the quiescent state path for a brief time after higher level input signals are detected while the high performance path is allowed to settle before switching to the high performance path.

Figure 7:
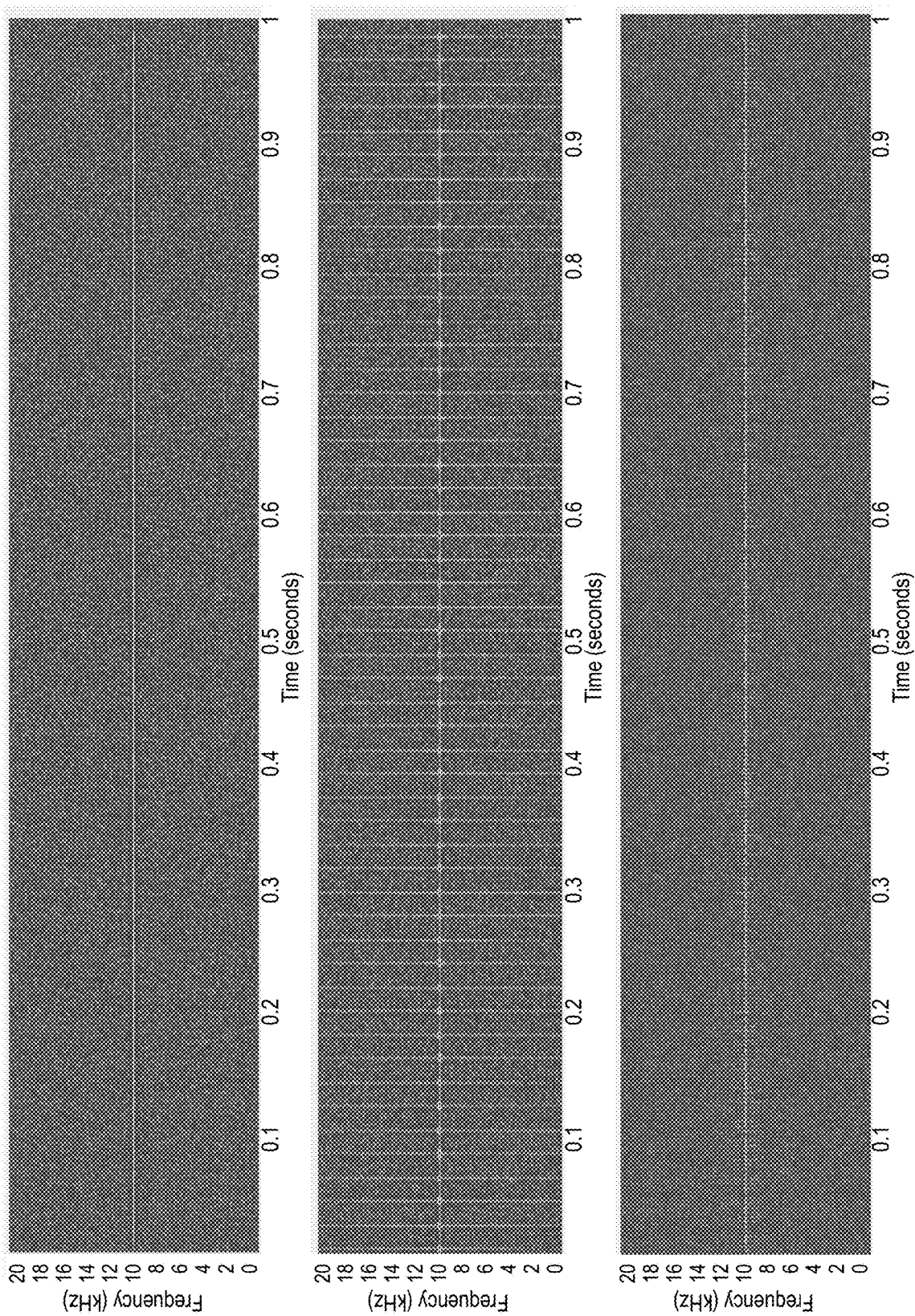
FIG. 7 is three spectrograms illustrating crossfading operation of a multi-path interpolator such as that of FIG. 3 according to an embodiment.

Referring now to FIG. 7, three spectrograms illustrating crossfading operation of the multi-path interpolator 204 of FIG. 3 according to an embodiment are shown. Each of the spectrograms illustrates a time interval of one second on the horizontal axis and frequency (in kHz) in an audio range (e.g., zero to 20 kHz) on the vertical axis. In the example of FIG. 7, the three spectrograms were obtained during simulation by providing a square wave as the digital input signal during the one second interval. In the top graph, the high power path 304 is selected/used during the entire one second interval. In the middle graph, immediate switching between the low power path 302 and the high power path 304 is performed approximately every 20 milliseconds. In the bottom graph, crossfading is employed to mix the outputs of the low power path 302 and the high power path 304 in a weighted manner during the switching transitions. As may be observed, the bottom spectrogram is much more similar to the top spectrogram than the middle spectrogram, indicating improved signal fidelity through employment of crossfading rather than immediate switching.

Figure 8:
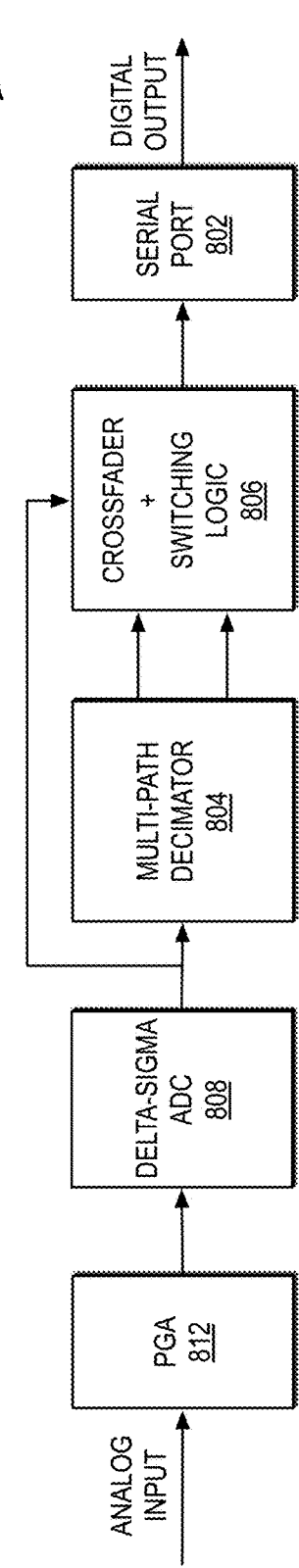
FIG. 8 is a block diagram of an embodiment of audio circuitry such as included in an audio IC of FIG. 1 that includes a multi-path decimator.

Referring now to FIG. 8, a block diagram of audio circuitry 800 (e.g., included in an audio IC 9 of FIG. 1), in accordance with embodiments of the present disclosure is shown. The audio circuitry 800 includes a programmable gain amplifier (PGA) 812 that receives an analog input signal (e.g., from an audio transducer or line level signal input), a delta-sigma ADC 808 that receives an analog output of the PGA 812, a multi-path decimator 804 that receives an output of the delta-sigma ADC 808 as a digital input signal, a block 806 that includes switching logic and a crossfader that receives outputs of the multiple paths of the multi-path decimator 804, and a serial port 802 that receives as its input an output of the switching logic and crossfader 806 and provides a digital output signal. The multi-path decimator 804 operates to decimate the digital input signal received from the delta-sigma ADC 808. As described in more detail below, the multi-path decimator 804 includes a low power path and a high power path whose outputs may be selected/used by the switching logic 806 based on one or more characteristics of the digital input signal (e.g., digital input signal frequency spectrum and/or signal level), and the unselected/unused path may be turned off. In this manner, advantageously, power consumption may be reduced as the monitored characteristic of the digital input signal permits. The switching logic 806 also receives the digital input signal from the delta-sigma ADC 808 in order to monitor the digital input signal.

Figure 9:
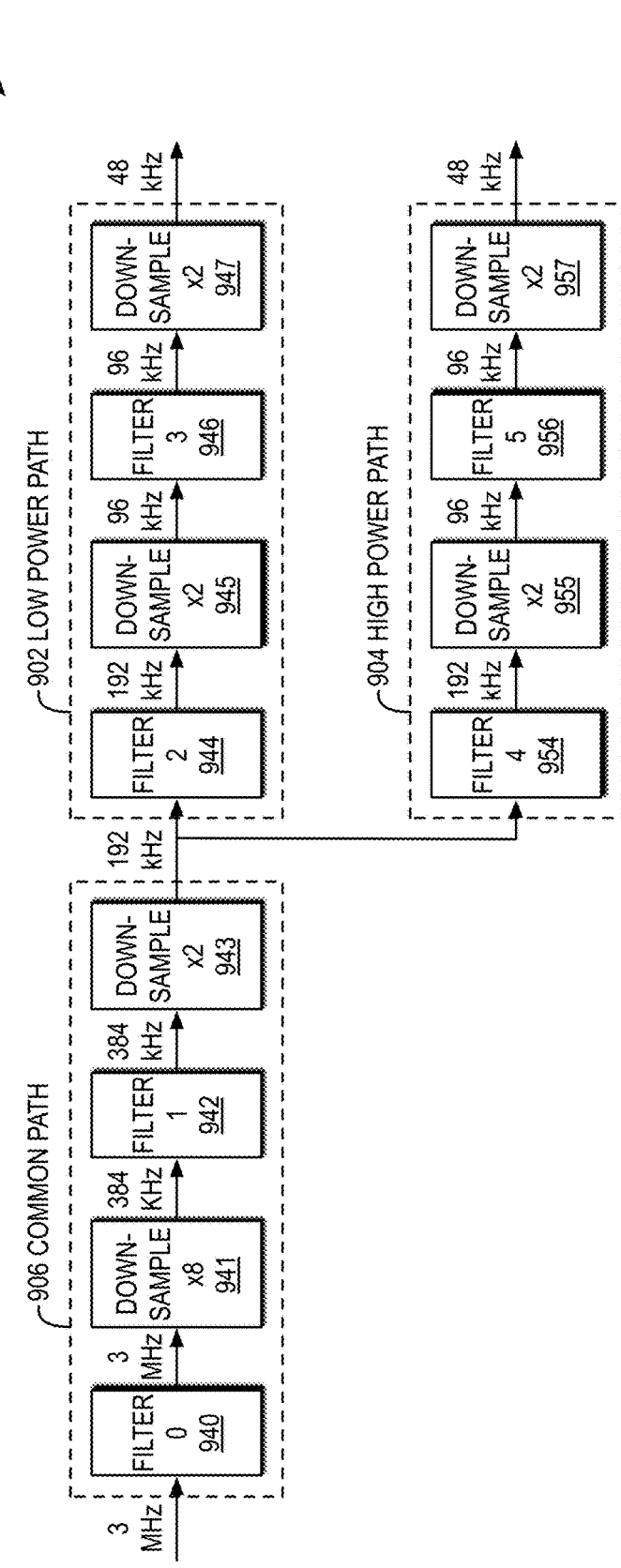
FIG. 9 is a block diagram of an embodiment of a multi-path decimator such as that of FIG. 8.

Referring now to FIG. 9, a block diagram of a multi-path decimator 804 (e.g., multi-path decimator 804 of FIG. 8), in accordance with embodiments of the present disclosure is shown. The multi-path decimator 804 includes a plurality of downsample stages and filter stages. In the embodiment of FIG. 9, the downsample stages and filter stages are grouped into a common path 906, a low power path 902 and a high power path 904. The common path 906 receives the analog input signal (e.g., 3 MHz), e.g., from the delta-sigma ADC 808. In the embodiment of FIG. 9, the common path 906 includes a filter 0 stage 940 that provides a filtered 3 MHz signal to a first downsample x8 stage 941 that outputs a 384 kHz signal received by a filter 1 stage 942 that provides a filtered 384 kHz signal to a second downsample x2 stage 943 that outputs a 192 kHz signal to both the low power path 902 and the high power path 904. The low power path 902 includes a filter 2 stage 944 that provides a filtered 192 kHz signal to a third downsample x2 stage 945 that outputs a 96 kHz signal received by a filter 3 stage 946 that provides a filtered 96 kHz signal to a fourth downsample x2 stage 947 that outputs a 48 kHz signal. The high power path 904 includes a filter 4 stage 954 that provides a filtered 192 kHz signal to a fifth downsample x2 stage 955 that outputs a 96 kHz signal received by a filter 5 stage 956 that provides a filtered 96 kHz signal to a sixth downsample x2 stage 957 that outputs a 48 kHz signal. The downsampling performed by the downsample stages creates images of out-of-band noise of the input signal that are folded back into the frequency band of interest (e.g., audio band), which is also referred to as aliasing. The filter stages attenuate the out-of-band noise in order to bury the folded-back/aliased images below the noise floor of the system. Generally speaking, the amplitude of the folded-back/aliased images caused by the downsampling of the input signal is proportional to the amplitude of the portion of the input signal attributable to the analog input to the PGA 812. Similarly, the spectral content richness of the folded-back/aliased images caused by the downsampling is proportional to the spectral content richness of the portion of the input signal attributable to the analog input to the PGA 812. Hence, when the amplitude or spectral richness of the input signal is higher, better filtering is required to remove the folded-back/aliased images; whereas, when the amplitude or spectral richness of the input signal is lower, worse filtering may be employed to remove the folded-back/aliased images, which may facilitate lower power consuming filters in the low power path 902. In one embodiment, the filter stages consume more power than the downsample stages. However, the multi-path decimator 804 must also filter the out-of-band noise injected by the delta-sigma ADC 808, which does not scale with the portion of the input signal attributable to the analog input to the PGA 812, as discussed in more detail below.

The low power path 902 consumes less power than the high power path 904 at quiescent state, i.e., in the presence of a minimal input signal. In one embodiment, the filter 2 stage 944 and filter 3 stage 946 consume less quiescent stage power than the filter 4 stage 954 and filter 5 stage 956, and filter 4 stage 954 and filter 5 stage 956 have higher filtering performance than filter 2 stage 944 and filter 3 stage 946. In one embodiment, the higher filtering performance may include superior stopband attenuation and/or superior passband ripple and/or superior transition band properties (e.g., smaller transition band). In one embodiment, the higher filtering performance may be accomplished because filter 4 stage 954 and filter 5 stage 956 have higher order filtering than filter 2 stage 944 and filter 3 stage 946 and/or because filter 4 stage 954 and filter 5 stage 956 have greater bit width than filter 2 stage 944 and filter 3 stage 946, which may enable filter 2 stage 944 and filter 3 stage 946 to consume less power than filter 4 stage 954 and filter 5 stage 956.

The switching logic 806 (of FIG. 8) monitors the digital input signal and based thereon selects the low power path 902 output or the high power path 904 output for use, i.e., for provision as the output (e.g., to the serial port 802 of FIG. 8). In one embodiment, the switching logic 806 selects the output of the low power path 902 or high power path 904 based on the signal level of the digital input signal. In another embodiment, the switching logic 806 includes circuitry that extracts the spectral content of the digital input signal (e.g., differentiator followed by a peak or average power detector, although other circuits that extract the spectral content may be employed), and the switching logic 806 selects the output of the low power path 902 or high power path 904 based on the frequency spectrum content of the digital input signal. In one embodiment, the switching logic 806 selects the low power path 902 or high power path 904 based on whether or not the spectral content has spectral components in a particular range of frequencies. For example, the switching logic 806 may select the high power path 904 if the spectral content of the digital input signal is less than 1.5 kHz threshold frequency and otherwise select the low power path 902. The embodiments may be particularly beneficial in instances in which energy content of audio frequencies above the threshold frequency is minimal in the digital input signal, which may often be the case, e.g., in the presence of a predominance of music or speech audio, because generally higher performing filters are required to filter content in the higher frequencies of the audio range. However, other embodiments are contemplated in which the threshold frequency is different and/or in which other spectral content criteria are employed.

During a transition between use of the low power path 902 and high power path 904 (in either direction), the crossfader 806 (of FIG. 8) mixes the outputs of the low power path 902 and high power path 904 in a weighted manner to provide the output. For example, during a transition from using the low power path 902 to using the high power path 904, the crossfader 806 will initially give more weight to the low power path 902 output and less weight to the high power path 904 and over the course of the transition reduce the weight of the low power path 902 and increase the weight of the high power path 904 until the weight of the low power path 902 is zero and the weight of the high power path 904 is one, at which time the switching logic 806 may power off the low power path 902 (which may be subject to a hysteresis delay, e.g., similar to the manner described with respect to FIGS. 5 and 6). An inverse operation may be performed by the crossfader 806 during a transition from using the high power path 904 to using the low power path 902.

Other embodiments of the multi-path decimator 804 are contemplated with different groupings of the plurality of downsample stages and filter stages. For example, embodiments are contemplated without a common path. For another example, embodiments are contemplated in which a common path follows the low power path 902 and high power path 904.

As may be observed, the operation of the multi-path decimator 804 is similar in many respects to the operation of the multi-path interpolator 204 in that the low power path may be used rather than the high power path when the input signal is at a low level and/or has a low frequency spectral content. However, a difference is the presence of the delta-sigma ADC 808 as a noise source in the audio circuitry 800 of FIG. 8. More specifically, the out-of-band noise generated by the delta-sigma ADC 808 does not scale with the analog input to the PGA 812, and it is the job of the multi-path decimator 804 to deal with the out-of-band noise generated by the delta-sigma ADC 808. Therefore, the stopband attenuation performance of the low power path 902 of the multi-path decimator 804 of the embodiment of the audio circuitry 800 of FIG. 8 may need to be approximately as good as the high power path 904; however, the low power path 902 may have lower filtering performance in other parameters such as transition band, ripple, etc., and therefore may advantageously still consume less quiescent state power. However, in an alternate audio circuitry embodiment (e.g., described below with respect to FIG. 11) that includes dynamic range enhancement (DRE) capabilities, the stopband attenuation performance may also be reduced in the low power path 902 relative to the high power path 904. Dynamic range is the ratio between the largest and smallest values of the audio output signal, e.g., the analog output signal of FIG. 2 or the digital output signal of FIG. 8.

Figure 10:
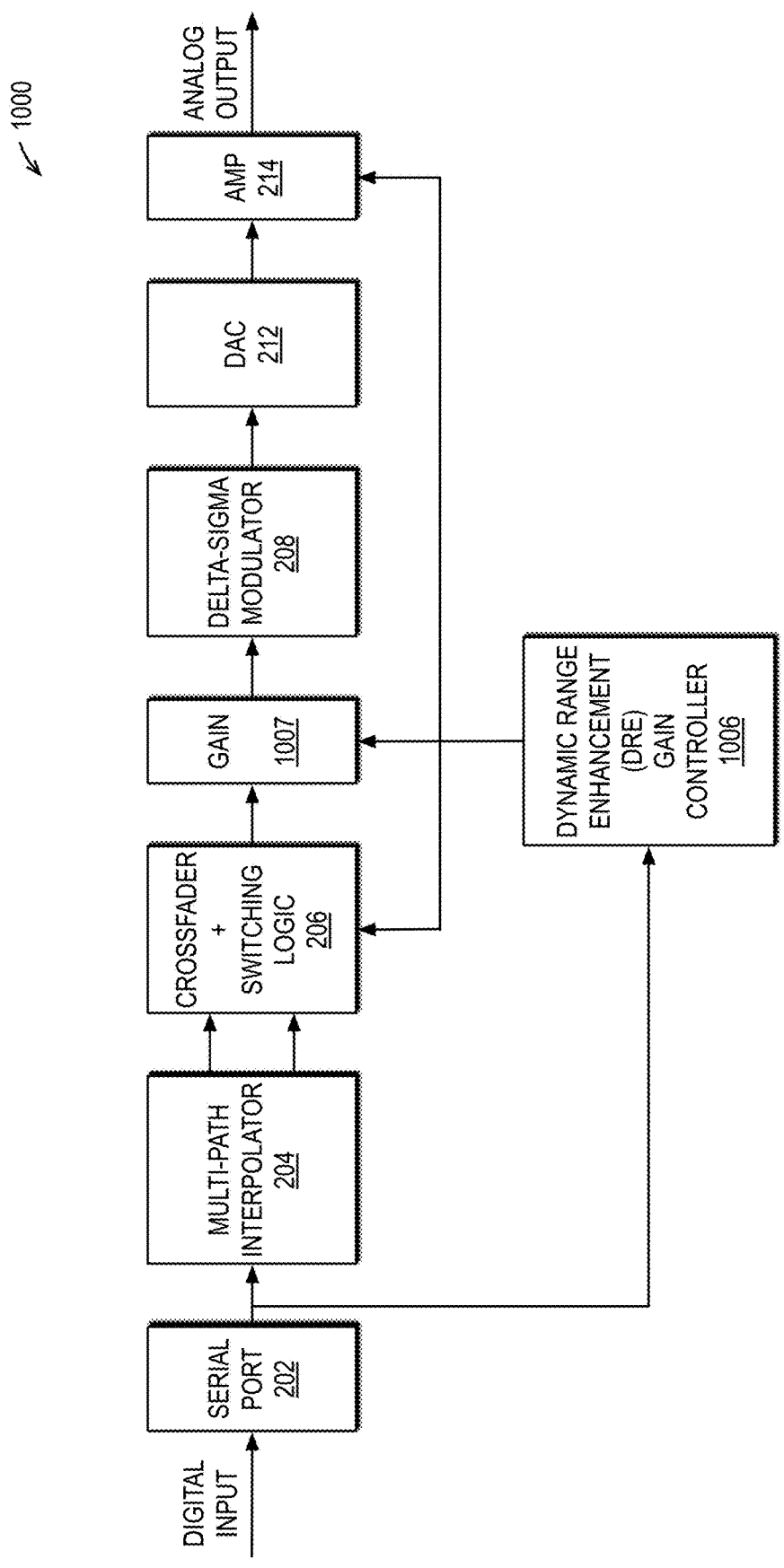
FIG. 10 is a block diagram of an alternate embodiment of audio circuitry such as may be included in an audio IC of FIG. 1 that includes a multi-path interpolator.

Referring now to FIG. 10, a block diagram of audio circuitry 1000 (e.g., included in an audio IC 9 of FIG. 1), in accordance with embodiments of the present disclosure is shown. The audio circuitry 1000 of FIG. 10 is similar in many respects to the audio circuitry 200 of FIG. 2. However, the audio circuitry 1000 of FIG. 10 incorporates dynamic range enhancement (DRE) and uses the DRE facilities to control the switching between the low power path 302 and high power path 304 of the multi-path interpolator 204. More specifically, the audio circuitry 1000 also includes a DRE gain controller 1006 and a digital gain block 1007. The digital gain block 1007 is interposed between the crossfader and switching logic block 206 and the delta-sigma modulator 208. The gain block 1007 receives the digital output signal of the crossfader 206 and adds gain in a digital fashion to generate an amplified digital signal provided to the delta-sigma modulator 208. The DRE gain controller 1006 controls the amount of digital gain applied by the gain block 1007. The DRE gain controller 1006 also controls the amount of analog gain applied by the amplifier 214 to the analog output. Finally, the DRE gain controller 1006 also communicates to the switching logic 206 changes in the digital and analog gain, and the switching logic 206 may control switching between the low power path 302 and the high power path 304 of the multi-path interpolator 204 based on changes in the digital and analog gain, as described in more detail below.

The DRE gain controller 1006 monitors the digital input signal and selectively controls the digital gain of the digital gain block 1007 and analog gain of the amplifier 214 based on a characteristic of the digital input signal. In one embodiment, the DRE gain controller 1006 monitors the level of the digital input signal, and when the level is below a threshold, the DRE gain controller 1006 increases the digital gain of the digital gain block 1007 (e.g., +12 dB) and simultaneously decreases the analog gain of the amplifier 214 by a corresponding amount (e.g., −12 dB) in order to optimize the noise floor of the system. The DRE gain controller 1006 communicates the digital input signal level information to the multi-path interpolator 204 which the multi-path interpolator 204 may use to control switching between low power path 302 and high power path 304, such as described above. Embodiments are contemplated in which the DRE gain controller 1006 may operate to control the digital and analog gain in a manner similar to that described in U.S. Pat. Nos. 9,391,576; 9,596,537; 9,998,823; 9,813,814 (the "DRE Patents"), each of which is hereby incorporated by reference herein for all purposes. In another embodiment, the DRE gain controller 1006 monitors the spectral content of the digital input signal, and when the frequency content is below a threshold frequency, the DRE gain controller 1006 increases the digital gain of the digital gain block 1007 and simultaneously decreases the analog gain of the amplifier 214 by a corresponding amount in order to optimize the noise floor of the system. The DRE gain controller 1006 communicates the digital input signal spectral content information to the multi-path interpolator 204 which the multi-path interpolator 204 may use to control switching between low power path 302 and high power path 304, such as described above.

Figure 11:
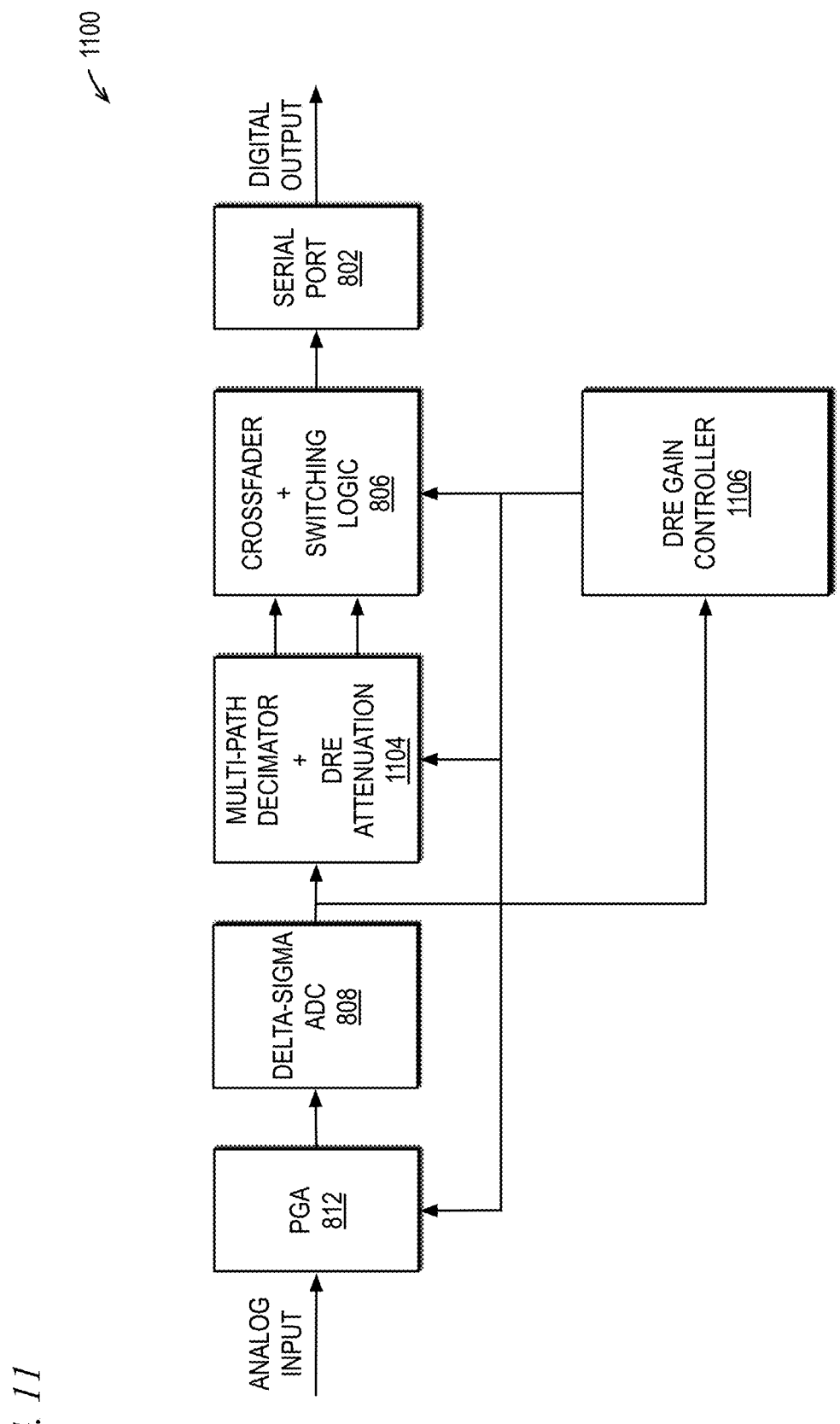
FIG. 11 is a block diagram of an alternate embodiment of audio circuitry such as included in an audio IC of FIG. 1 that includes a multi-path decimator.

Referring now to FIG. 11, a block diagram of audio circuitry 1100 (e.g., included in an audio IC 9 of FIG. 1), in accordance with embodiments of the present disclosure is shown. The audio circuitry 1100 of FIG. 11 is similar in many respects to the audio circuitry 800 of FIG. 8. However, the audio circuitry 1100 of FIG. 11 incorporates dynamic range enhancement (DRE) and uses the DRE facilities to control the switching between the low power path 902 and high power path 904 of the multi-path decimator 804. More specifically, the audio circuitry 1100 also includes a DRE gain controller 1106, and the multi-path decimator 1104 includes a DRE digital attenuation block, as described in more detail below with respect to FIG. 11. The DRE gain controller 1106 controls the amount of digital attenuation applied by the DRE attenuation block. The DRE gain controller 1106 also controls the amount of analog gain applied by the PGA 812 to the analog input. Finally, the DRE gain controller 1106 also communicates to the switching logic 806 changes in the digital and analog gain, and the switching logic 806 may control switching between the low power path 902 and the high power path 904 of the multi-path decimator 804 based on changes in the digital and analog gain, as described in more detail below.

The DRE gain controller 1106 monitors the digital input signal and selectively controls the digital gain of the DRE attenuation block of the multi-path decimator 1104 and analog gain of the PGA 812 based on a characteristic of the digital input signal. In one embodiment, the DRE gain controller 1106 monitors the level of the digital input signal, and when the level is below a threshold (e.g., −60 dBFs), the DRE gain controller 1106 increases the analog gain of the PGA 812 (e.g., +12 dB) and simultaneously applies the digital attenuation of the DRE attenuation block by a corresponding amount (e.g., −12 dB) in order to optimize the noise floor of the system. When in DRE mode (i.e., when the digital input signal level is below the threshold and the DRE gain controller 1106 simultaneously changes the analog and digital gains), the out-of-band noise generated by the delta-sigma ADC 808 sees an attenuation (e.g., 12 dB) as compared to the analog input signal. Therefore, it may be acceptable to switch the multi-path decimator 804 to use the lower stopband attenuation of the low power path 902. This switch assumes the primary goal of the decimator 804 is to remove out-of-band noise from the delta-sigma ADC 808 rather than out-of-band tones from the analog input signal (which are attenuated by the PGA 812 roll-off). The DRE gain controller 1106 communicates the digital input signal level information to the multi-path decimator 1104 which the multi-path decimator 1104 may use to control switching between low power path 902 and high power path 904, such as described above. Embodiments are contemplated in which the DRE gain controller 1106 may operate to control the digital and analog gain in a manner similar to that described in the DRE Patents listed above. In another embodiment, the DRE gain controller 1106 monitors the spectral content of the digital input signal, and when the frequency content is below a threshold frequency (e.g., 1.5 kHz), the DRE gain controller 1106 increases the analog gain of the PGA 812 (e.g., +12 dB) and simultaneously applies the digital attenuation of the DRE attenuation block by a corresponding amount (e.g., −12 dB) in order to optimize the noise floor of the system. The DRE gain controller 1106 communicates the digital input signal spectral content information to the multi-path decimator 804 which the multi-path decimator 804 may use to control switching between low power path 902 and high power path 904, such as described above.

Figure 12:
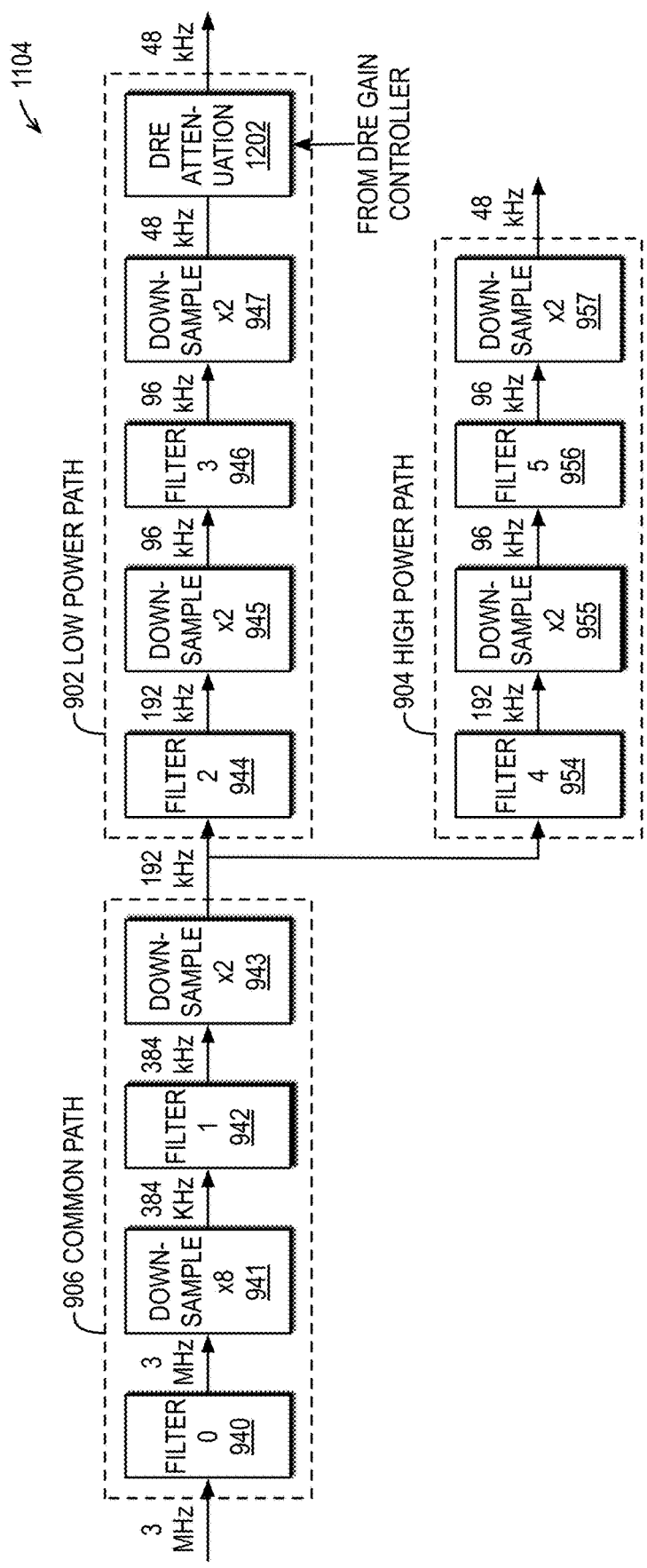
FIG. 12 is a block diagram of an alternate embodiment of a multi-path decimator such as that of FIG. 11.

Referring now to FIG. 12, a block diagram of a multi-path decimator 1104 (e.g., multi-path decimator 1104 of FIG. 11), in accordance with alternate embodiments of the present disclosure is shown. The multi-path decimator 1104 of FIG. 12 is similar in many respects to the multi-path decimator 804 of FIG. 8. However, the low power path 902 also includes a DRE attenuation block 1202 that receives and attenuates the 48 kHz signal output by the fourth downsample x2 stage 947 to provide an attenuated 48 kHz signal to the crossfader 806. The amount of digital attenuation applied by the DRE attenuation block 1202 is controlled by the DRE gain controller 1106. More specifically, the DRE gain controller 1106 may control the PGA 812 to increase the analog gain and control the DRE attenuation block 1202 to apply the digital attenuation when the input signal has a low level or poor spectral content, as described above. An advantage of the embodiment of FIG. 12 may be that the aliased-back effect caused by downsampling on the out-of-band noise injected by the delta-sigma ADC 808 at lower input signal levels is lesser. Stated alternatively, the embodiment of FIGS. 11 and 12 may cause the out-of-band noise injected by the delta-sigma ADC 808, and which by downsampling is aliased into the frequency region of interest at the output of the low power path 902, to effectively scale based on the input signal level.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, unless otherwise indicated, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure refers to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein. All examples and conditional language recited herein are intended for pedagogical objects to aid the reader in understanding the disclosure and the concepts contributed by the inventor to furthering the art and are construed as being without limitation to such specifically recited examples and conditions.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

The invention claimed is:

1. An apparatus for performing interpolation in a digital circuit that receives an input signal, comprising:
   a plurality of upsampling stages and filtering stages used to perform interpolation;
   wherein a first path comprises a first portion of the plurality of upsampling stages and filtering stages, and a second path comprises a second portion of the plurality of upsampling stages and filtering stages distinct from the first portion;
   wherein the first path consumes less quiescent state power than the second path; and
   a selection circuit configured to:
     determine a spectral content of the input signal; and
     use the first or second path and turn off the unused first or second path based on the spectral content.

2. The apparatus of claim 1,
   wherein the selection circuit is configured to use the first or second path and turn off the unused first or second path based on whether or not the spectral content has spectral components in a particular range of frequencies.

3. The apparatus of claim 1, further comprising:
   a cross-fader that uses the first and second paths in a weighted mix manner while making a transition between using the first and second paths.

4. The apparatus of claim 1,
   wherein the second path has higher filtering performance than the first path.

5. The apparatus of claim 4,
   wherein the higher filtering performance comprises one or more of the following:
     superior stopband attenuation;
     superior passband ripple; and
     superior transition band.

6. The apparatus of claim 4,
   wherein the higher filtering performance is accomplished using one or more of the following:
     higher order filtering; and
     a greater bit-width filter.

7. The apparatus of claim 1,
   wherein the apparatus has a mode in which, in conjunction with the first path being used and the second path being turned off, a digital gain is applied to an output of the upsampling stages and filtering stages and an analog attenuation corresponding to the digital gain is applied by an analog back end.

8. A method for performing interpolation in a digital circuit that receives an input signal, comprising:
   wherein the digital circuit includes a plurality of upsampling stages and filtering stages used to perform the interpolation;
   wherein a first path comprises a first portion of the plurality of upsampling stages and filtering stages, and a second path comprises a second portion of the plurality of upsampling stages and filtering stages distinct from the first portion;
   wherein the first path consumes less quiescent state power than the second path;
   determining a spectral content of the input signal; and
   using the first or second path and turning off the unused first or second path based on the spectral content.

9. The method of claim 8,
   wherein said using the first or second path and turning off the unused first or second path based on the spectral content comprises using the first or second path and turning off the unused first or second path based on whether or not the spectral content has spectral components in a particular range of frequencies.

10. The method of claim 8, further comprising:
    using the first and second paths in a weighted mix manner while making a transition between using the first and second paths.

11. The method of claim 8,
    wherein the second path has higher filtering performance than the first path.

12. The method of claim 11,
    wherein the higher filtering performance comprises one or more of the following:
      superior stopband attenuation;
      superior passband ripple; and
      superior transition band.

13. The method of claim 11,
    wherein the higher filtering performance is accomplished using one or more of the following:
      higher order filtering; and
      a greater bit-width filter.

14. The method of claim 8, further comprising:
    in conjunction with the first path being used and the second path being turned off:
      applying a digital gain to an output of the upsampling stages and filtering stages and applying an analog attenuation corresponding to the digital gain by an analog back end.

15. An apparatus for performing interpolation in a digital circuit that receives an input signal, comprising:
    a plurality of upsampling stages and filtering stages used to perform interpolation;
    wherein a first path comprises a first portion of the plurality of upsampling stages and filtering stages, and a second path comprises a second portion of the plurality of upsampling stages and filtering stages distinct from the first portion;
    wherein the first path consumes less quiescent state power than the second path;
    wherein the second path has higher filtering performance than the first path; and
    a selection circuit configured to use the first or second path and turn off the unused first or second path based on a level of the input signal.

16. A method for performing interpolation in a digital circuit that receives an input signal, comprising:
    wherein the digital circuit includes a plurality of upsampling stages and filtering stages used to perform interpolation;
    wherein a first path comprises a first portion of the plurality of upsampling stages and filtering stages, and a second path comprises a second portion of the plurality of upsampling stages and filtering stages distinct from the first portion;

wherein the first path consumes less quiescent state power than the second path;

wherein the second path has higher filtering performance than the first path; and using the first or second path and turning off the unused first or second path based on a level of the input signal.

17. An apparatus for performing decimation in a digital circuit that receives an input signal, comprising:

a plurality of downsampling stages and filtering stages used to perform decimation;

wherein a first path comprises a first portion of the plurality of downsampling stages and filtering stages, and a second path comprises a second portion of the plurality of downsampling stages and filtering stages distinct from the first portion;

wherein the first path consumes less quiescent state power than the second path; and a selection circuit configured to:
determine a spectral content of the input signal; and
use the first or second path and turn off the unused first or second path based on the spectral content.

18. The apparatus of claim 17, wherein the digital circuit is fed by an analog front end that receives an analog input signal; and wherein the apparatus has a mode in which the analog front end applies an analog gain on the analog input signal and the first path applies a digital attenuation corresponding to the analog gain.

19. The apparatus of claim 17, further comprising:

a cross-fader that uses the first and second paths in a weighted mix manner while making a transition between using the first and second paths.

20. The apparatus of claim 17, wherein the second path has higher filtering performance than the first path.

21. A method for performing decimation in a digital circuit that receives an input signal, comprising:

wherein a plurality of downsampling stages and filtering stages used to perform decimation;

wherein a first path comprises a first portion of the plurality of downsampling stages and filtering stages, and a second path comprises a second portion of the plurality of downsampling stages and filtering stages distinct from the first portion;

wherein the first path consumes less quiescent state power than the second path; and determining a spectral content of the input signal; and using the first or second path and turning off the unused first or second path based on the spectral content.

22. The apparatus of claim 21, further comprising:

wherein the digital circuit is fed by an analog front end that receives an analog input signal; and applying, by the analog front end, an analog gain on the analog input signal and applying, by the first path, a digital attenuation corresponding to the analog gain.

23. The method of claim 21, further comprising:

using the first and second paths in a weighted mix manner while making a transition between using the first and second paths.

24. The apparatus of claim 21, wherein the second path has higher filtering performance than the first path.

25. An apparatus for performing decimation in a digital circuit that receives an input signal, comprising:

a plurality of downsampling stages and filtering stages used to perform decimation;

wherein a first path comprises a first portion of the plurality of downsampling stages and filtering stages, and a second path comprises a second portion of the plurality of downsampling stages and filtering stages distinct from the first portion;

wherein the first path consumes less quiescent state power than the second path; and a selection circuit configured to use the first or second path and turn off the unused first or second path based on a level of the input signal.

26. The apparatus of claim 25, wherein the digital circuit is fed by an analog front end that receives an analog input signal; and wherein the apparatus has a mode in which the analog front end applies an analog gain on the analog input signal and the first path applies a digital attenuation corresponding to the analog gain.

27. A method for performing decimation in a digital circuit that receives an input signal, comprising:

wherein a plurality of downsampling stages and filtering stages used to perform decimation;

wherein a first path comprises a first portion of the plurality of downsampling stages and filtering stages, and a second path comprises a second portion of the plurality of downsampling stages and filtering stages distinct from the first portion;

wherein the first path consumes less quiescent state power than the second path; and using the first or second path and turning off the unused first or second path based on a level of the input signal.

28. The method of claim 27, wherein the digital circuit is fed by an analog front end that receives an analog input signal; and applying, by the analog front end, an analog gain on the analog input signal and applying, by the first path, a digital attenuation corresponding to the analog gain.

* * * * *

UNITED STATES PATENT AND TRADEMARK OFFICE
CERTIFICATE OF CORRECTION

PATENT NO. : 10,840,891 B2
APPLICATION NO. : 16/231936
DATED : November 17, 2020
INVENTOR(S) : Satoskar et al.

Page 1 of 1

It is certified that error appears in the above-identified patent and that said Letters Patent is hereby corrected as shown below:

In the Claims

In Column 17, Line 46, in Claim 21, delete "path; and" and insert -- path; --, therefor.

In Column 17, Line 50, in Claim 22, delete "apparatus" and insert -- method --, therefor.

In Column 18, Line 8, in Claim 24, delete "apparatus" and insert -- method --, therefor.

Signed and Sealed this
Twenty-sixth Day of January, 2021

Drew Hirshfeld
*Performing the Functions and Duties of the*
*Under Secretary of Commerce for Intellectual Property and*
*Director of the United States Patent and Trademark Office*